United States Patent
Wu

(10) Patent No.: US 10,027,329 B2
(45) Date of Patent: Jul. 17, 2018

(54) NOR GATE CIRCUIT, SHIFT REGISTER, ARRAY SUBSTRATE AND DISPLAY APPARATUS

(71) Applicant: BOE Technology Group Co., Ltd., Beijing (CN)

(72) Inventor: Zhongyuan Wu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/304,751

(22) PCT Filed: Oct. 29, 2015

(86) PCT No.: PCT/CN2015/093228
§ 371 (c)(1),
(2) Date: Oct. 17, 2016

(87) PCT Pub. No.: WO2016/197523
PCT Pub. Date: Dec. 15, 2016

(65) Prior Publication Data
US 2017/0141777 A1    May 18, 2017

(30) Foreign Application Priority Data
Jun. 10, 2015 (CN) .......................... 2015 1 0317200

(51) Int. Cl.
*H03K 19/20* (2006.01)
*H03K 19/094* (2006.01)
(Continued)

(52) U.S. Cl.
CPC ........... *H03K 19/20* (2013.01); *G09G 3/2092* (2013.01); *G11C 19/28* (2013.01); *H01L 27/124* (2013.01);
(Continued)

(58) Field of Classification Search
CPC ................. H03K 19/20; G09G 3/2092; G09G 2300/0842; G09G 2300/0871;
(Continued)

(56) References Cited

U.S. PATENT DOCUMENTS 3,506,851 A * 4/1970 Dierking ................. G11C 5/00
326/83
2004/0253781 A1* 12/2004 Kimura ............ H03K 19/01850
438/222
2012/0242370 A1* 9/2012 Park ....................... H03K 19/20
326/112

FOREIGN PATENT DOCUMENTS

CN 101212220 A 7/2008
CN 103413531 A 11/2013
(Continued)

OTHER PUBLICATIONS

Feb. 29, 2016—(WO) International Search Report and Written Opinion Appn PCT/CN2015/093228 with English Tran.
(Continued)

*Primary Examiner* — Daniel D Chang
(74) *Attorney, Agent, or Firm* — Banner & Witcoff, Ltd.

(57) ABSTRACT

Provided are an NOR gate circuit, a shift register, an array substrate and a display apparatus, wherein the NOR gate circuit comprises a first inverter and a second inverter, each of the first inverter and the second inverter having an input terminal (VIN), a high voltage terminal (VGH), a low voltage terminal (VGL) and an output terminal (VOUT), the output terminal (VOUT) of the first inverter being connected to the high voltage terminal (VGH) of the second inverter, and wherein at least one of the first inverter and the second inverter comprises: a first transistor (T1; T5) having a gate connected to a first node (VA), a first electrode connected to the high voltage terminal (VGH) and a second electrode connected to the output terminal (VOUT), a first capacitor
(Continued)

(C1; C2) having a first terminal connected to the first node (VA) and a second terminal connected to the output terminal (VOUT), a pulling-up module being configured to pull up a potential at the first node (VA) by a potential at the high voltage terminal (VGH) in a case where the high voltage terminal (VGH) is at a high level, and a pulling-down module being configured to pull down a potential at the first node (VA) and a potential at the output terminal (VOUT) by a potential at the low voltage terminal (VGL) under a control of a signal received by the input terminal (VIN). The threshold loss existing in the NOR gate circuit formed by an Oxide TFT can be eliminated.

18 Claims, 6 Drawing Sheets

(51) Int. Cl.
| | | |
|---|---|---|
| | *H01L 27/12* | (2006.01) |
| | *H01L 29/786* | (2006.01) |
| | *G11C 19/28* | (2006.01) |
| | *G09G 3/20* | (2006.01) |

(52) U.S. Cl.
CPC ...... *H01L 27/1225* (2013.01); *H01L 27/1251* (2013.01); *H01L 27/1255* (2013.01); *H01L 29/7869* (2013.01); *G09G 2300/0842* (2013.01); *G09G 2300/0871* (2013.01); *G09G 2310/0286* (2013.01)

(58) Field of Classification Search
CPC ............ G09G 2310/0286; G11C 19/28; H01L 27/1225; H01L 27/124; H01L 27/1251; H01L 27/1255; H01L 29/7869
USPC .......................................................... 326/121
See application file for complete search history.

(56) References Cited

FOREIGN PATENT DOCUMENTS

| | | |
|---|---|---|
| CN | 103560782 A | 2/2014 |
| CN | 103795401 A | 5/2014 |
| CN | 104883181 A | 9/2015 |
| JP | 4321266 B2 | 8/2009 |

OTHER PUBLICATIONS

May 31, 2017—(CN) First Office Action Appn 201510317200.4 with English Tran.

Oct. 24, 2017—(CN) Second Office Action Appn 201510317200.4 with English Tran.

\* cited by examiner

NOR GATE CIRCUIT, SHIFT REGISTER, ARRAY SUBSTRATE AND DISPLAY APPARATUS

The application is a U.S. National Phase Entry of International Application No. PCT/CN2015/093228 filed on Oct. 29, 2015, designating the United States of America and claiming priority to Chinese Patent Application No. 201510317200.4 filed on Jun. 10, 2015. The present application claims priority to and the benefit of the above-identified applications and the above-identified applications are incorporated by reference herein in their entirety.

TECHNICAL FIELD

The present disclosure relates to a field of display technique, and particularly to an NOR gate circuit, a shift register, an array substrate and a display apparatus.

BACKGROUND

In existing display apparatuses, NOR gate circuit is frequently arranged as a logic gate circuit in a scan driving circuit for supplying scanning signal in a row direction. Currently, through different manufacture processes, many different types of elements can be employed to implement an NOR gate circuit in a scan driving circuit of a display apparatus, such as an a-Si (Amorphous Silicon) TFT (Thin Film Transistor), an LTPS (Low Temperature Poly-silicon) TFT or an Oxide type TFT, wherein an a-Si TFT has a mature manufacture process and a low cost but with defects such as a low mobility ratio and a poor stability, and an LTPS TFT has a fast speed and a good stability but with a poor uniformity, a high manufacture cost and an inadaptability of manufacture for those large-sized panels. Therefore, The technique adopting Oxide TFTs becomes more suitable for large-sized panel display in the future, due to its advantages such as a high mobility ratio, a good uniformity and a low manufacture cost.

However, a transfer characteristic of an Oxide TFT is usually of a depletion mode, meaning that TFT remains in a turning-on status in a case in which its gate-to-source voltage Vgs is equal to zero. Therefore, in a case in which an Oxide TFT is adopted to form an NOR gate circuit, a voltage at an output terminal will suffer a loss to some extent as a function of a magnitude of TFT threshold voltage, "threshold loss" for short, affecting operating performance of the NOR gate circuit.

SUMMARY

Accordingly, the present disclosure provides an NOR gate circuit, a shift register, an array substrate and a display apparatus, through which a threshold loss in an NOR gate circuit formed by an Oxide TFT can be eliminated.

In a first aspect, the present disclosure provides an NOR gate circuit, comprising a first inverter and a second inverter, wherein each of the first inverter and the second inverter has an input terminal, a high voltage terminal, a low voltage terminal and an output terminal, the output terminal of the first inverter being connected with the high voltage terminal of the second inverter, and wherein at least one of the first inverter and the second inverter comprises:

a first transistor having a gate connected to a first node, a first electrode connected to the high voltage terminal and a second electrode connected to the output terminal;

a first capacitor having a first terminal connected to the first node and a second node connected to the output terminal;

a pulling-up module connected to the high voltage terminal and the first node, and configured to pull up a potential at the first node by a potential at the high voltage terminal when the high voltage terminal is at a high level; and a pulling-down module connected the input terminal, the first node, the low voltage terminal and the output terminal, and configured to pull down a potential at the first node and a potential at the output terminal by a potential at the low voltage terminal under a control of a signal received at the input terminal.

Optionally, the pulling-up module comprises a second transistor having a gate connected to the high voltage terminal, a first electrode connected to the high voltage terminal and a second electrode connected to the first node.

Optionally, the pulling-down module comprises: a third transistor having a gate connected to the input terminal, a first electrode connected to the first node and a second electrode connected to the low voltage terminal; and a fourth transistor having a gate connected to the input terminal, a first electrode connected to the output terminal and a second electrode connected to the low voltage terminal.

Optionally, a width-length ratio of the third transistor is larger than that of the second transistor.

Optionally, the low voltage terminal of the first inverter is connected to the low voltage terminal of the second inverter.

Optionally, the first transistor is an Oxide Thin Film Transistor.

Optionally, all transistors in the NOR gate circuit are N-type Oxide Thin Film Transistors.

Optionally, a high level at the high voltage terminal of each of the first inverter and the second inverter is equal to a high level of the signal received at the input terminal, a low level at the low voltage terminal of at least one of the first inverter and the second inverter is higher than a low level of the signal received at the input terminal.

Optionally, the first inverter and the second inverter have a same circuit configuration.

In a second aspect, the present disclosure further provides a shift register comprising any NOR gate circuit described above.

In a third aspect, the present disclosure further provides an array substrate comprising any shift register described above.

In a fourth aspect, the present disclosure further provides a display apparatus comprising any array substrate described above or any shift register described above.

According to the above technical solutions of the present disclosure, based on the above circuit structure, when the NOR gate outputs a high level, a gate-to-source voltage of the first transistor can be maintained by the first capacitor at a level which is high enough, through which a threshold loss in an NOR gate circuit formed by an Oxide TFT can be eliminated.

Further, the above NOR gate circuit can implement an NOR operation without threshold loss through a simple structure and the gate-source-voltage of the first transistor is further increased due to the first capacitor. Therefore, the above circuit can achieve a faster transition speed from a low level to a high level and can achieve a better operating performance.

BRIEF DESCRIPTION OF THE DRAWINGS

In order to explain technical solutions according to embodiments of the present disclosure and the known solutions in more details, a brief instruction will be made below to the figures to be used in the descriptions related to embodiments of the present disclosure and the known solutions. Obviously, those figures described below only illustrate some embodiments of the present disclosure. Those skilled in the art can obtain other figures according to these figures without paying any inventive works.

DETAILED DESCRIPTION OF THE PREFERRED EMBODIMENTS

In order to make the purposes, technical solutions and advantages of embodiments of the present disclosure clearer, the technical solutions of embodiments of the present disclosure will be described below clearly and fully in connection with the figures of the embodiments of the present disclosure. Obviously, the described embodiments are only a part but not all of the embodiments. Based on those embodiments of the present disclosure, all the other embodiments obtained by those skilled in the art without inventive works belong to a scope intended to be protected by the present disclosure.

Figure 1:
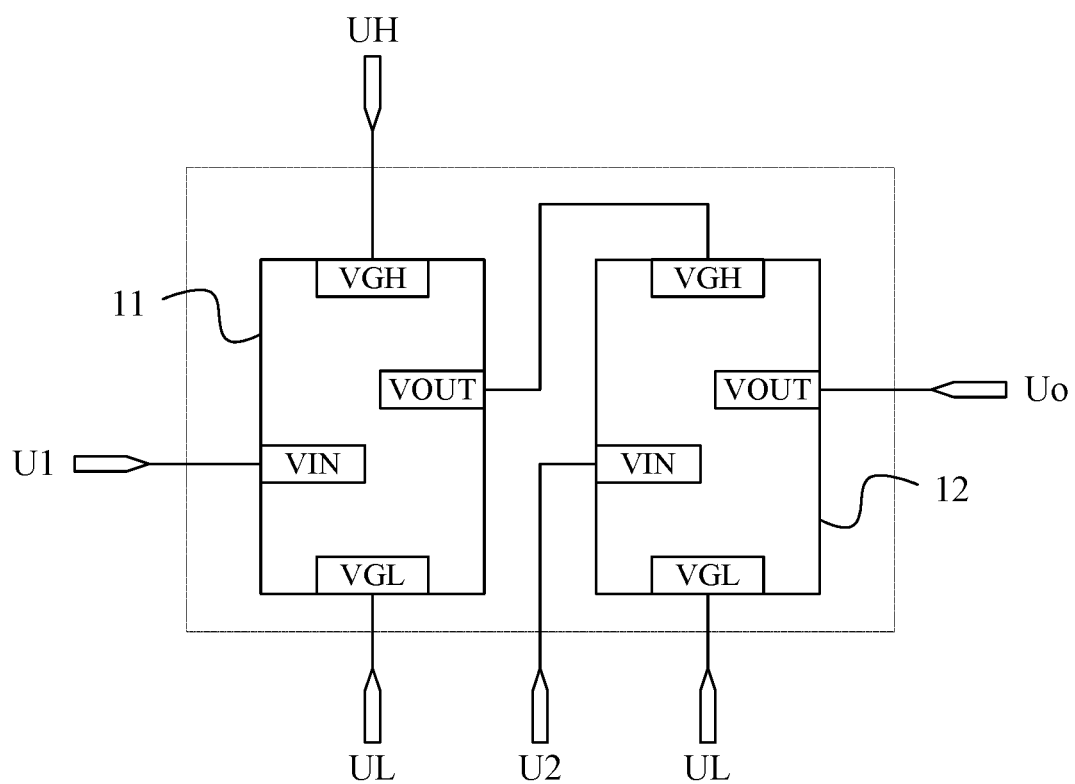
FIG. 1 is a block diagram of a structure of an NOR gate circuit in on embodiment of the present disclosure.

FIG. 1 is a block diagram of a structure of a NOR gate circuit in one embodiment of the present disclosure. Referring to FIG. 1, the NOR gate circuit (illustrated by the structure in the dash line block) comprises a first inverter 11 and a second inverter 12, each of the first inverter 11 and the second inverter 12 having an input terminal VIN, a high voltage terminal VGH, a low voltage terminal VGL and an output terminal VOUT, and the output terminal VOUT of the first inverter 11 being connected to the high voltage terminal VGH of the second inverter 12.

It should be understood that for each of the first inverter 11 and the second inverter 12, in a case where the high voltage terminal VGH is connected to a high level and the low voltage terminal VGL is connected to a low level, a signal, which can be output at the output terminal VOUT, has a level opposite to that at the input terminal VIN (the VOUT at a high level in a case of VIN at a low level, and VOUT at a low level in a case of VIN at a high level). Therefore, in a case where the output terminal VOUT of the first inverter 11 is at a low level, the second inverter 12 is in a state without any output and its output terminal VOUT is at a low level, while the second inverter 12 will be in a normal operating state only if the output terminal VOUT of the first inverter 11 is at a high level.

It should be noted that both "high level" and "low level" herein are referring to "1" and "0" in a logic circuit, configuration of which is well known to those skilled and details of which are omitted herein. Besides, each of the transistors comprises a gate, a source and a drain, wherein the gate is a control electrode, and for convenience of description, one of the source and the drain is a first electrode and the other is a second electrode, which are also well known to those skilled in the art and details of which are thus omitted herein.

Therefore, let a level at the input terminal of the first inverter 11 be U1, a level at the input terminal of the second inverter 12 be U2, the high level terminal VGH of the first inverter 11 be connected to a high level bias voltage VH, and low voltage terminals VGLs of both the first inverter 11 and the second inverter 12 be connected to a low level bias voltage UL, a level Uo at the output terminal VOUT of the second inverter 12 can satisfy the following logic relationship:

$$Uo = \overline{U1} \cdot \overline{U2} = \overline{U1 + U2}$$

It can be seen that the NOR gate circuit can implement an NOR logic operation. It should be noted that, in embodiments of the present disclosure, each the first inverter 11 and the second inverter 12 described above refers to a circuit configuration with a operating characteristic described above. Of course, the first inverter 11 and the second inverter 12 described above can have either the same or different configurations.

Figure 2:
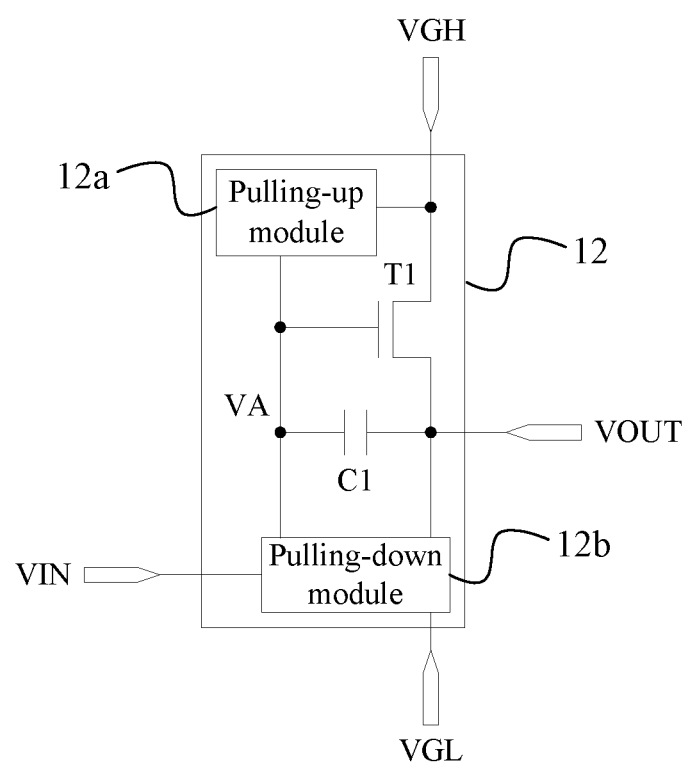
FIG. 2 is a schematic diagram of a circuit structure of a second inverter in the NOR gate circuit illustrated in FIG. 1.

FIG. 2 is a schematic diagram of a circuit structure of the second inverter of the NOR gate circuit illustrated in FIG. 1. Referring to FIG. 2, the above second inverter 12 comprises a first transistor T1, a first capacitor C1, a pulling-up module 12a and a pulling-down module 12b, wherein:

the first transistor T1 has a gate connected to a first node VA (referring to a circuit node inside the second inverter), a first electrode connected to the above high voltage terminal VGH and a second electrode connected to the above output terminal VOUT, and the first capacitor C1 has a first terminal connected to the above first node VA and a second terminal connected to the above output terminal VOUT;

the pulling-up module 12a is connected to the above high voltage terminal VGH and is configured to pull up a potential at the above first node VA by a potential at the above high voltage terminal VGH in a case where the high voltage terminal VGH is at a high level, which can be implemented by a circuit structure comprising a diode or a transistor, for example;

the pulling-down module 12b is connected to the above input terminal VIN, the above low voltage terminal VGL and the above output terminal VOUT, and is configured to pull down potentials at the above first node VA and the above output terminal VOUT by a potential at the low voltage terminal VGL under a control of a signal received at the above input terminal VIN, which can be implemented by a circuit structure of a switch device including a transistor, a Hall switch element or a relay, for example.

Based the above circuit structure, according to an embodiment of the present disclosure, a gate-to-source voltage of the first transistor T1 can be maintained high enough by the first capacitor in a case where the NOR gate circuit outputs a high level. In particular, the pulling-up module 12a can pull up the potential at the first node VA in a case where the high voltage terminal VGH is at a high level, so that the first transistor T1 will be in a turning-on state, causing the potential at the output terminal VOUT to be pulled up meanwhile. However, since the first capacitor C1 has an effect of bootstrap on a voltage across its both terminals during this process, the potential at the first node VA will be further pulled up and be higher than the high level at the high voltage terminal VGH. In this way, the gate-to-source voltage of the first transistor T1 can be larger than zero during the period in which the output terminal VOUT is at a high level, through which a source-to-drain current of the first transistor T1 is large enough so that a transition speed of the potential at the output terminal VOUT from a low level to a high level is increased, and moreover a threshold voltage which may exist in the first transistor T1 will not have an effect on the potential of the high level at the output terminal VOUT so that the above "threshold loss" is eliminated.

It should be noted that types of those transistors involved herein can be selected by those skilled in the art according to particular application scenarios. For example, any of those transistors herein can be either of an N-type or a P-type transistor. On such a basis, those skilled in the art can configure adaptively what structures to be connected to the source and drain respectively, depending on the selected transistor being of N-type or P-type, which is not limited by the present disclosure. Specially, in a case where the selected transistor is a transistor with a symmetrical structure for the source and drain, the source and the drain may not be distinguished for such a transistor.

It can be seen that the threshold loss existing in the NOR gate circuit formed by an Oxide TFT can be eliminated according to the embodiments of the present disclosure. Further, the above NOR gate circuit can implement an NOR operation without threshold loss through a simple structure, and since the first capacitor C1 further raises the gate-to-source voltage of the first transistor T1, the above circuit can achieve a faster transition speed from a low level to a high level and thus achieve a better operating performance.

Figure 3:
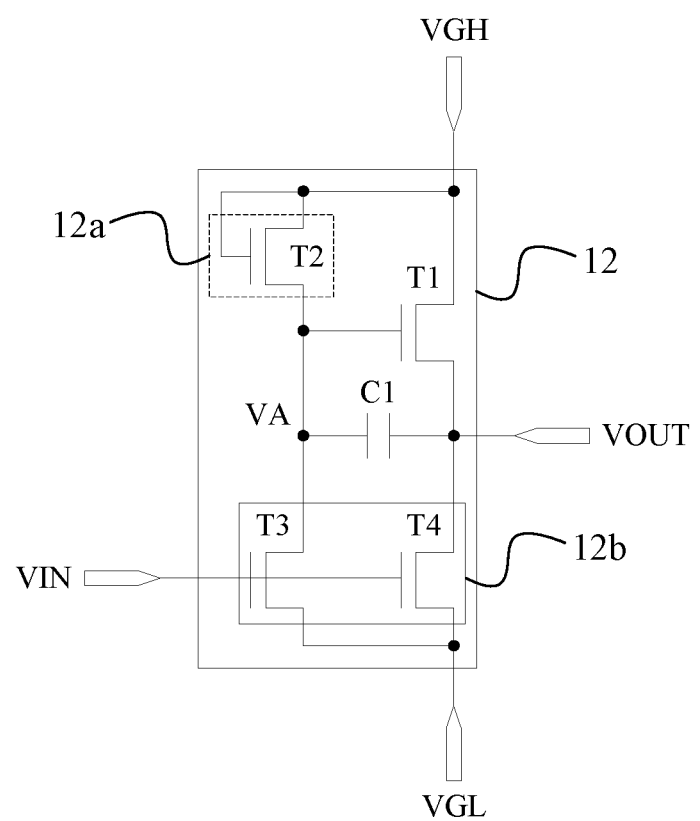
FIG. 3 is a schematic diagram of a circuit structure of a second inverter in an NOR gate circuit in one embodiment of the present disclosure.

As an example, FIG. 3 is a schematic diagram of a circuit structure of a second inverter in an NOR gate circuit in one embodiment of the present disclosure.

Referring to FIG. 3, on the basis of the circuit structure illustrated as FIG. 2, the pulling-up module 12a in the embodiment of the present disclosure comprises particularly a second transistor T2 having a gate connected to the above high voltage terminal VGH, a first electrode connected to the above high voltage terminal VGH and a second electrode connected to the above first node VA. On such a basis, the second transistor T2 can generate a current flowing from the above high voltage terminal VGH to the above first node VA when the high voltage terminal VGH is at a high level, so that the potential at the first node VA is pulled up and the function of the above pulling-up module 12a is implemented. That is, the embodiment of the present disclosure can make use of one transistor to implement the function of the above pulling-up module 12a, benefiting a simplification of the above circuit structure.

Meanwhile, the pulling-down module 12b in the embodiment of the present disclosure comprises a third transistor T3 and a fourth transistor T4, wherein the third transistor T3 has a gate connected to the above input terminal VIN, a first electrode connected to the above first node VA and a second electrode connected to the above low voltage terminal VGL, and the fourth transistor T4 has a gate connected to the above input terminal VIN, a first electrode connected to the above output terminal VOUT and a second electrode connected to the above low voltage terminal VGL. On such a basis, the third transistor T3 and the fourth transistor T4 can generate a current flowing from the first node VA to the low voltage terminal VGL and a current flowing from the output terminal VOUT to the low voltage terminal VGL under a control of a signal received by the above input terminal VIN, so that potentials at the first node VA and the above output terminal VOUT can be pulled down and the function of the above pulling-down module 12b is implemented. That is, the embodiment of the present disclosure can make use of two transistors to implement the function of the pulling-down module 12b, benefiting a simplification of the above circuit structure.

Figure 4:
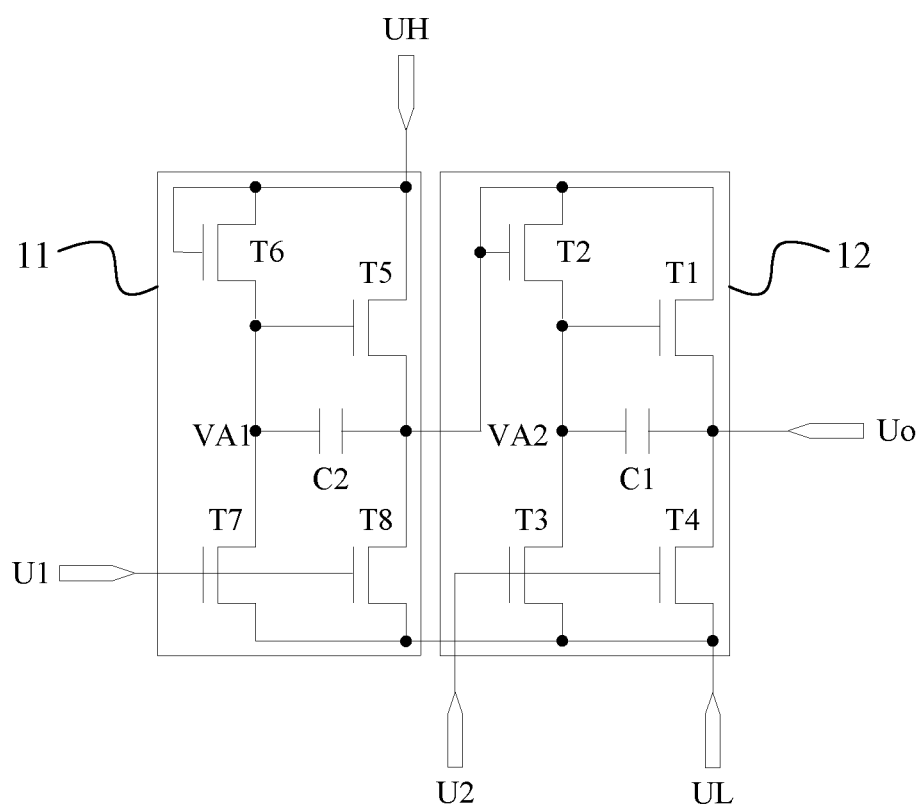
FIG. 4 is a schematic diagram of a structure of an NOR gate circuit in on embodiment of the present disclosure.

As a more particular example, FIG. 4 is a schematic diagram of a structure of an NOR gate circuit in one embodiment of the present application. Referring to FIG. 4, the first inverter 11 in the embodiment of the present disclosure has the same circuit structure with the second inverter 12 illustrated as FIG. 3. In particular, corresponding to the first transistor T1, the first capacitor C1, the second transistor T2, the third transistor T3 and the fourth transistor T4 in the above second inverter 12, the first inverter 11 in the embodiment of the present disclosure comprises a fifth transistor T5, a second capacitor C2, a sixth transistor T6, a seventh transistor T7 and an eighth transistor T8 and has the same or a similar inside connection relationship. On such a basis, the first inverter 11 and the second inverter 12 can be manufactured through the same process, and meanwhile the first inverter 11 can also have those good operating characteristics of the above second inverter 12, benefiting a decrease of cost and an improvement of performance for the NOR gate circuit.

In another aspect, in the embodiment of the present disclosure, the low voltage terminal of the first inverter 11 is connected to the low voltage terminal of the second inverter 12 so that the whole NOR gate circuit can have a uniform reference low voltage. Let the reference low voltage be UL, similarly, it can be set that a first input signal of the NOR gate circuit in the embodiment of the present disclosure is equal to U1, a second input signal equal to U2, a reference high level equal to UH and an output signal equal to Uo.

In addition, all of the transistors in the embodiments of the present disclosure are N-type Oxide Thin Film Transistors, and for each of the transistors in FIG. 4, the upper electrode is a source and the lower electrode is a drain. On such a basis, a uniformity of the manufacture process of the whole circuit can be achieved, benefiting a decrease of the cost. However, an Oxide TFT suffers from a defect of a large leaking current. Therefore, the UL at the above low voltage terminal of the first inverter 11 and the second inverter 12 can be made higher than the potentials of low levels of the signals U1 and U2 received by the input terminal, so that the gate-to-source voltages of the transistors T7, T8 can be lower than zero after the potential at the first node VA or the output terminal VOUT are pulled down, so as to solve efficiently the problem of too large leaking current of the transistor. On the other hand, in order to keep the high level of the above Uo consistent with the high levels of U1 and U2, the high level at the high voltage terminals VGHs of the first inverter 11 and the second inverter 12 can be made consistent with the high level of the signal received by the input terminal VIN.

In particular, the operating principle of the NOR gate circuit illustrated as FIG. 4 is as follows.

When U1 is at a high level and U2 is also at a high level, both T7 and T8 are in a turning-on state, so that the potentials at the gate of T1 and at the output terminal of the first inverter 11 are pulled down, T1 is in a turning-off state and both the gate and the drain of T2 are at the low level UL output from the inverter 11. Meanwhile, since the high level of U2 cause both T3 and T4 to be in a turning-on state, the potential at Uo will also be pulled down to the low level UL.

When U1 is at a low level and U2 is at a high level, both T7 and T8 are in the turning-off state, and the potential at the gate of T5 is pulled up under an effect of T6, so that T5 is turned on and the first inverter 11 outputs a high level UH. However, both T3 and T4 are in a turning-on state due to the high level of U2, and the potential at VA2 in the second inverter 12 is pulled up by T2 and meanwhile is pulled down by T3. In this case, the pull up current can be made to be much less than the pull down current through a design of width-length ratio of T2 to that of T3 so that the potential at the above VA2 is at a low level (the width-length ratio of the second transistor T2 is less or much less than that of the third transistor T3). Thus, T1 is in a turning-off state, and Uo remains at the low level UL under an pulling-down effect of T4.

When U1 is at a high level and U2 is at a low level, for the same reasons, the first inverter 11 will output a low level UL. If the first node VA2 in the second inverter 12 is now at a high level, the current from the source to drain of T1 can cause the potential at Uo to be pulled down to the low level UL.

When U1 is at a low level and U2 is at a low level, for the same reasons, the first inverter 11 will output a high level UH. At this time, the potential at the gate of T1 will be first pulled up to a level even higher than the high level UH under a combined effect of both T2 and C1, so that the level at Uo is pulled up to the high level UH rapidly.

Figure 5:
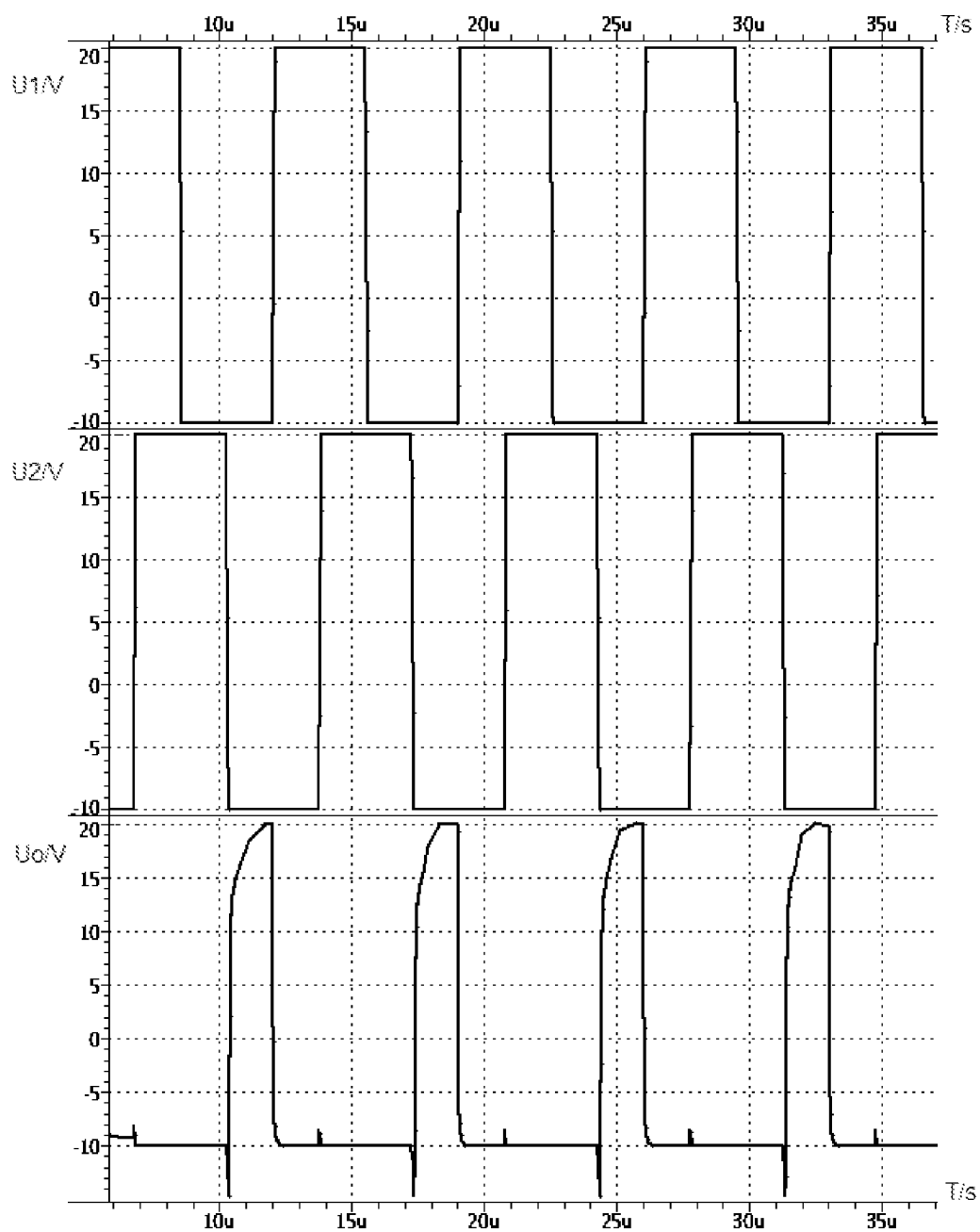
FIG. 5 is a simulation result of the NOR gate circuit illustrated in FIG. 4.

As an illustration of the above operating principle, FIG. 5 is a simulation result of the NOR gate circuit illustrated by FIG. 4. It can be seen that the relationships among U1, U2 and Uo of the NOR gate circuit are illustrated in the following table.

TABLE 1 table of relationships between input and output of NOR gate circuit

|    | Uo         | U1 High Level | U1 Low Level |
|----|------------|---------------|--------------|
| U2 | High Level | UL            | UL           |
|    | Low Level  | UL            | UH           |

It can be seen that the NOR gate circuit provided by the embodiments of the present disclosure can implement an NOR operation without threshold loss through a simple structure (the maximum Uo can reach 20V which is equal to that of both U1 and U2), and since the gate-to-source voltage of the first transistor is further increased due to the first capacitor, the above circuit can have a faster transition speed from a low level to a high level (a rising edge of Uo is less than 2 us) and can achieve a better operating performance.

It should be noted that, in any of the above NOR gate circuits, the first transistor T1 can adopt an Oxide TFT. On such a basis, the above first transistor can have the features such as a high mobility ratio, a good uniformity and a low manufacture cost.

Figure 6:
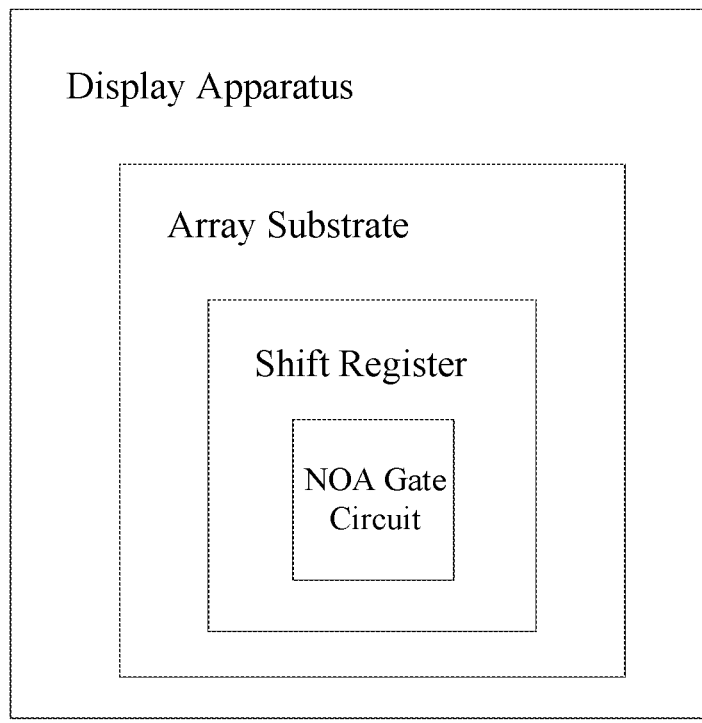
FIG. 6 is a block diagram of a structure of a display apparatus according to one embodiment of the present disclosure.

FIG. 6 is a block diagram of a structure of a display apparatus according to one embodiment of the present disclosure.

Based on the same inventive concept, an embodiment of the present disclosure provides a shift register comprising any of the above NOR gate circuits and a scan driving circuit comprising the above shift register. For example, in a case where the shift register in a scan driving circuit is formed by a SR trigger, the NOR gate in the SR trigger can adopt any of the above NOR gate circuit. Of course, the circuit part for processing the NOR logic operations in the scan driving circuit can be implemented by adopting any of the above NOR gate circuit. The same technical problem can be solved and a similar technical effect can be achieved, since the scan driving circuit includes any one of the above NOR gate circuit.

Based on the same inventive concept, an embodiment of the present disclosure provides an array substrate comprising any of the above scan driving circuits. For example, the array substrate can be an array substrate of a GOA (Gate Driver On Array) type, so that the scan driving circuit including the NOR gate circuit illustrated in FIG. 4 can be arranged on the array substrate. Since the array substrate includes any one of the above shift register and the scan driving circuit, and therefore the same technical problem can be solved and a similar technical effect can be achieved.

Based on the same inventive concept, an embodiment of the present disclosure provides a display apparatus comprising any of the above array substrates (for example, an array substrate of a GOA type) or any of the above scan driving circuit (for example, being arranged on a circuit board the periphery of the array substrate). It should be noted that the display apparatus in the embodiment can be any product or part with a display function such as a display panel, a cell phone, a tablet computer, a TV set, a laptop computer, a digital frame and a navigator. The same technical problem can be solved and a similar technical effect can be achieved since the display apparatus comprises any of the above array substrates or any of the above scan driving circuits.

It should be noted that, in the description of the present disclosure, the terms indicating orientations or position relationships such as "above", "below" and the like which are based on the orientation or position relationship illustrated in the attaching drawings, and are only for facilitating and simplifying the description of the present disclosure, rather than meaning or implying that the mentioned apparatus or element must have a specific orientation or must be constructed or operate in a specific orientation, and therefore should not be understood as limitations to the present disclosure. The terms of "installing", "connecting" and "connected" should be understood in a broad sense, which, for example, can mean a fixed connection or a removable connection or an integrated connection, can mean a mechanical connection or an electrical connection, and can mean a direct connection or an indirect connection through an intermediary or a connection inside two elements, unless being specified and defined otherwise. Those skilled in the art can understand the particular meanings of the above terms herein in the specific cases.

It should be also noted that the terms indicating relationships such as "first" and "second" are only used to distinguish one entity or operation from the other, but not necessarily require or imply there are such actual relationships or order among these entities or operations. Moreover, the terms of "include", "comprise" or any other variations intend to cover a non-exclusive including, so that the processes, methods, articles or devices including a series of elements comprises not only those elements but also other elements not listed explicitly or inherent elements of such processes, methods, articles or devices. In a case of no further limitations, the elements defined by the sentence of "comprising a" do not exclude the existence of other elements in the processes, methods, articles or devices of the described elements.

The above embodiments are only for the purpose of describing the technical solutions of the present disclosure rather than limiting thereto. Although the present disclosure has been described in details by referring to the aforementioned embodiments, those skilled in the art should understand that modification can be made to the technical solutions in each of the aforementioned embodiments, or equivalent substitutions can be made to part of the technical features therein. And these modifications and substitutions will not cause the corresponding technical solutions to depart substantially from the spirit and scope of the technical solutions of respective embodiments of the present disclosure.

The present application claims the priority of Chinese Patent Application No. 201510317200.4 filed on Jun. 10, 2015, the entire contents disclosed by which are incorporated herein as a part of the present application by reference.

What is claimed is:

1. An NOR gate circuit, comprising a first inverter and a second inverter, wherein each of the first inverter and the second inverter has an input terminal, a high voltage terminal, a low voltage terminal and an output terminal, the output terminal of the first inverter being connected with the high voltage terminal of the second inverter, and wherein at least one of the first inverter and the second inverter comprises:
    a first transistor having a gate connected to a first node, a first electrode connected to the high voltage terminal and a second electrode connected to the output terminal, wherein the first transistor is an Oxide Thin Film Transistor;
    a first capacitor having a first terminal connected to the first node and a second node connected to the output terminal;
    a pulling-up module connected to the high voltage terminal and the first node, and configured to pull up a potential at the first node by a potential at the high voltage terminal when the high voltage terminal is at a high level; and
    a pulling-down module connected the input terminal, the first node, the low voltage terminal and the output terminal, and configured to pull down a potential at the first node and a potential at the output terminal by a potential at the low voltage terminal under a control of a signal received at the input terminal, wherein a low level at the low voltage terminal of at least one of the first inverter and the second inverter is higher than a low level of the signal received at the input terminal.

2. The NOR gate circuit of claim 1, wherein the pulling-up module comprises a second transistor having a gate connected to the high voltage terminal, a first electrode connected to the high voltage terminal and a second electrode connected to the first node.

3. The NOR gate circuit of claim 2, wherein the pulling-down module comprises:
    a third transistor having a gate connected to the input terminal, a first electrode connected to the first node and a second electrode connected to the low voltage terminal; and
    a fourth transistor having a gate connected to the input terminal, a first electrode connected to the output terminal and a second electrode connected to the low voltage terminal.

4. The NOR gate circuit of claim 3, wherein a width-length ratio of the third transistor is larger than that of the second transistor.

5. The NOR gate circuit of claim 1, wherein the low voltage terminal of the first inverter is connected to the low voltage terminal of the second inverter.

6. The NOR gate circuit of claim 1, wherein all transistors in the NOR gate circuit are N-type Oxide Thin Film Transistors.

7. The NOR gate circuit of claim 6, wherein a high level at the high voltage terminal of each of the first inverter and the second inverter is equal to a high level of the signal received at the input terminal.

8. The NOR gate circuit of claim 1, wherein the first inverter has a same circuit configuration as that of the second inverter.

9. A shift register comprising the NOR gate circuit of claim 1.

10. An array substrate comprising the shift register of claim 9.

11. A display apparatus comprising the array substrate of claim 10.

12. A display apparatus comprising the array substrate of claim 9.

13. The shift register of claim 9, wherein the pulling-up module comprises a second transistor having a gate connected to the high voltage terminal, a first electrode connected to the high voltage terminal and a second electrode connected to the first node.

14. The shift register of claim 13, wherein the pulling-down module comprises:
    a third transistor having a gate connected to the input terminal, a first electrode connected to the first node and a second electrode connected to the low voltage terminal; and
    a fourth transistor having a gate connected to the input terminal, a first electrode connected to the output terminal and a second electrode connected to the low voltage terminal.

15. The shift register of claim 14, wherein a width-length ratio of the third transistor is larger than that of the second transistor.

16. The shift register of claim 9, wherein the low voltage terminal of the first inverter is connected to the low voltage terminal of the second inverter.

17. The shift register of claim 9, wherein all transistors in the NOR gate circuit are N-type Oxide Thin Film Transistors.

18. The shift register of claim 17, wherein a high level at the high voltage terminal of each of the first inverter and the second inverter is equal to a high level of the signal received at the input terminal.

* * * * *